United States Patent [19]

Smith et al.

[11] Patent Number: 5,077,092
[45] Date of Patent: Dec. 31, 1991

[54] METHOD AND APPARATUS FOR DEPOSITION OF ZINC SULFIDE FILMS

[75] Inventors: Patricia B. Smith, Euless; Larry D. Hutchins, Richardson; Rudy L. York, Plano; Joseph D. Luttmer, Richardson; Cecil J. Davis, Greenville, all of Tex.

[73] Assignee: Texas Instruments Incorporated, Dallas, Tex.

[21] Appl. No.: 374,883

[22] Filed: Jun. 30, 1989

[51] Int. Cl.⁵ ............................................. C23C 16/00
[52] U.S. Cl. ............................ 427/255.2; 427/255.1; 427/255; 427/248.1; 427/126.1; 427/314
[58] Field of Search ............... 427/255.2, 255.1, 248.1, 427/126.1, 255, 314; 428/332

[56] References Cited

U.S. PATENT DOCUMENTS 4,447,469  5/1984  Peters ............................. 427/54.1
4,504,521  3/1985  Widmer et al. .................. 427/85

FOREIGN PATENT DOCUMENTS 61-166967  7/1986  Japan.
61-166968  7/1986  Japan.
61-166969  7/1986  Japan.
61-205694  9/1986  Japan.
61-205695  9/1986  Japan.
61-205696  9/1986  Japan.
61-243177  10/1986  Japan.
61-243179  10/1986  Japan.
61-243180  10/1986  Japan.

Primary Examiner—Shrive Beck
Assistant Examiner—Roy V. King
Attorney, Agent, or Firm—René E. Grossman; Melvin Sharp

[57] ABSTRACT

The deposition of zinc sulfide films (16) using dimethylzinc (46) and hydrogen sulfide (44) in a vacuum processor reactor (50) provides a low temperature process applicable for high volume production of infrared focal planes. These layers (16) of zinc sulfide are used as insulators and infrared anti-reflective coatings which are free of contamination relative to physical vapor deposited ZnS films. The zinc sulfide layers (16) are formed by evacuating a chamber (62) and mixing hydrogen sulfide gas (44) and dimethylzinc gas (46) at specific operating conditions until the desired ZnS film thickness is obtained. The rate of growth of the zinc sulfide (16) film is controlled by varying the temperature, pressure, and the relative flow rates of the hydrogen sulfide gas (44) and the dimethylzinc gas (46).

5 Claims, 2 Drawing Sheets

METHOD AND APPARATUS FOR DEPOSITION OF ZINC SULFIDE FILMS

TECHNICAL FIELD OF THE INVENTION

This invention relates in general to a method and apparatus for depositing a film on a substrate and in particular to a method and apparatus for depositing zinc sulfide films on a substrate using the reaction of dimethylzinc gas and hydrogen sulfide gas in a vacuum processor.

BACKGROUND OF THE INVENTION

When manufacturing infrared focal plane array detectors, one of the critical components is the zinc sulfide film which is deposited on the semiconductor substrate. The zinc sulfide (ZnS) film serves as the insulator in the metal-insulator-semiconductor (MIS) structures forming the detectors. Additionally, the MOCVD ZnS films are used as interlevel insulators and anti-reflection coatings in the manufacture of infrared device structures. Control of the thickness of the ZnS films is critical to the performance of the IR device because the capacitance of a detector element is inversely proportional to the zinc sulfide film thickness. Accordingly, the zinc sulfide deposition process needs to provide exceptional film thickness control and reliability. Additionally, with the advent of slice-level processing, film thickness uniformity across the entire slice is necessary for high volume production.

In the past, zinc sulfide films have been deposited by physical vapor deposition (PVD) processes. Even though the electrical and optical properties of zinc sulfide are well suited for use in an infrared detector, previously developed PVD processes of film deposition have produced films with an inherently high density of defects and with poor step coverage, and are thus not well suited for integrated circuit (IC) fabrication.

When using PVD processes, an evaporator or a sputtering system are generally utilized which creates undesirable side effects, such as particle accumulation, on the evaporator chamber walls. This causes excessive flaking of the particles from the reactor walls and leads to the incorporation of particles into the growing ZnS film which contaminates the semiconductor substrate being processed Ultimately, such particle contamination leads to device degradation or failure resulting from electrical shorts or opens.

More recently, the deposition of zinc sulfide films has been accomplished using a metal organic chemical vapor deposition (MOCVD) process by combining hydrogen sulfide and dimethylzinc gases. Despite the advancement in the MOCVD process, an apparatus or process had not been developed which could accomplish the deposition of uniform films at the low deposition temperature necessary for use in the production of infrared detectors. Prior art exists for MOCVD ZnS film deposition using hydrogen sulfide and dimethylzinc at substrate temperatures between 250° C. and 500° C. to produce very high quality epitaxial ZnS layers. The reactant gases in this case are diluted in $H_2$ or He carrier gases. The substrate temperatures required for the epitaxial-quality ZnS films would cause serious degradation of the HgCdTe substrate commonly used as the infrared detector material in focal plane devices, primarily due to Hg loss from the HgCdTe. A need has therefore arisen for an apparatus and process which can easily deposit zinc sulfide films using dimethylzinc gas and hydrogen sulfide gas at a low temperature (less than 100° C.) with minimal contamination, and which is capable of being utilized in the high volume production of infrared focal plane detectors. While the discussion focuses on M-I-S detector structures, the uses of MOCVD low temperature ZnS films are not limited to such structures. This technology is applicable to other IR detector types including, but not limited to, photodiodes and photoconductors.

SUMMARY OF THE INVENTION

In accordance with the present invention, a metal organic chemical vapor deposition (MOCVD) process and associated apparatus for depositing zinc sulfide films are provided which substantially eliminate or reduce disadvantages and problems associated with prior physical vapor deposition (PVD) technology.

One aspect of the invention comprises an apparatus and a process for depositing a layer of zinc sulfide on a surface of a selected substrate contained in a vacuum chamber After potential contaminating gases are removed from the chamber by pumping to a vacuum, hydrogen sulfide gas is admitted to the chamber through a gas dispersion ring at a pressure less than atmospheric To obtain the desired chemical reaction, dimethylzinc gas is circulated through the chamber, using a second gas dispersion ring coaxial with the $H_2S$ dispersion ring, to react with the hydrogen sulfide to form the zinc sulfide layer on the substrate surface The thickness of the zinc sulfide layer can be controlled by monitoring the deposition time of the reaction between dimethylzinc gas and hydrogen sulfide gas. After the desired thickness of zinc sulfide film has been obtained on the substrate surface, the flow of dimethylzinc is stopped, while $H_2S$ flow continues to purge the reactor of excess reactant and product gases. $H_2S$ flow is then stopped, and the reactor evacuated to about $10^{-3}$ torr vacuum to expel the poisonous hydrogen sulfide gas from the system. Nitrogen gas is admitted to the reactor at atmospheric pressure prior to retrieving the substrate containing the ZnS film. The apparatus and method are particularly advantageous in the manufacture of infrared focal plane array detectors and the like.

The present invention, disclosing an MOCVD process, presents technical advantages over prior PVD processes used for forming zinc sulfide layers on substrates because of increased throughput, superior conformality, process simplifications, quality control relating to the uniformity of the deposition material, and reduction of contamination on the face of the substrate. The reduction of particulate contamination results from the processing of the films on a substrate held upside-down during the film growth. This substantially reduces the probability that any ZnS molecules which might nucleate in the gas phase, or any other foreign matter in the growth zone, will settle on the growing film. Such "particulate" incorporation is vastly reduced by using a reactor incorporating an upside-down substrate.

BRIEF DESCRIPTION OF THE DRAWINGS

Other aspects of the invention and their advantages will be discerned after studying the detailed description in connection with the drawings in which.

DETAILED DESCRIPTION OF THE INVENTION

Figure 1:
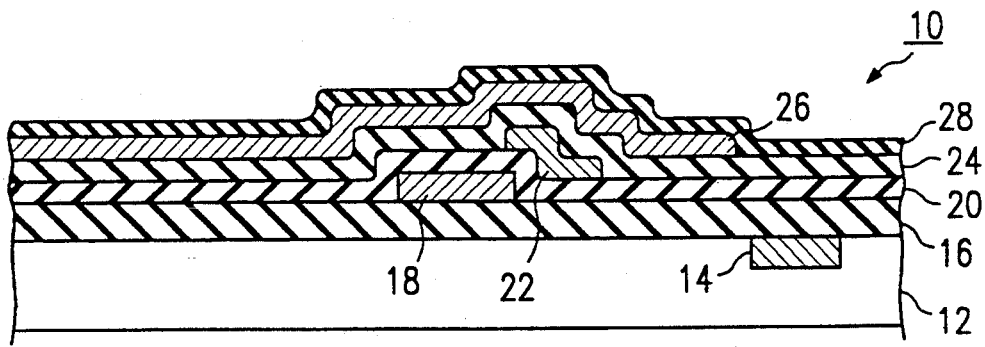
FIG. 1 is a cross-sectional view of an example of an integrated circuit workpiece illustrating the deposition steps in a zinc sulfide process according to the present invention.

Referring to FIG. 1, an integrated circuit device formed according to the invention is shown in an enlarged schematic cross-sectional view and is generally designated 10. Device 10 comprises a charge imaging matrix (CIM), with zinc sulfide films formed according to the present process at low temperatures while reducing particulate contamination.

FIG. 1 illustrates charge imaging matrix device 10 including a substrate 12 having a diode 14 formed therein. Substrate 12 may comprise, for example, mercury cadmium telluride (HgCdTe). Initially, a zinc sulfide layer 16 is deposited onto the surface of substrate 12 and diode 14. A first conductive layer 18 is formed over first zinc sulfide layer 16 by any method well known in the pertinent art. First conductive layer 18 may be made of gold, silver, copper, aluminum or any alloy thereof, or of any other suitable material known in the art. Similar to the deposition of first layer 16, a second layer of zinc sulfide 20 is deposited onto first layer 16 of the zinc sulfide to embed first conductive layer 18 between said layers 16 and 20. A second conductive layer 22 is formed over second zinc sulfide layer 20. Likewise, a third zinc sulfide layer 24 is deposited onto second conductive layer 22 Similarly, a third conductive layer 26 is formed over third zinc sulfide layer 24 in a manner known in the art. Finally, to complete the charge imaging matrix device 10, a final fourth zinc sulfide layer 28 is deposited onto the exposed surface of device 10. The sum total of layers 16, 20, 24 and 28 comprise an anti-reflective coating.

As can be appreciated, dielectric films for infrared detectors must be infrared-transparent in order to provide an anti-reflective coating which is used to enhance the collection ability of the HgCdTe-based detectors. Accordingly, infrared devices that require isolation of the overlapping conductors must exhibit good insulator integrity. The present process enables zinc sulfide layers to be manufactured at low temperatures in high volume production. Significant reductions in particulate contamination have been observed.

Figure 2:
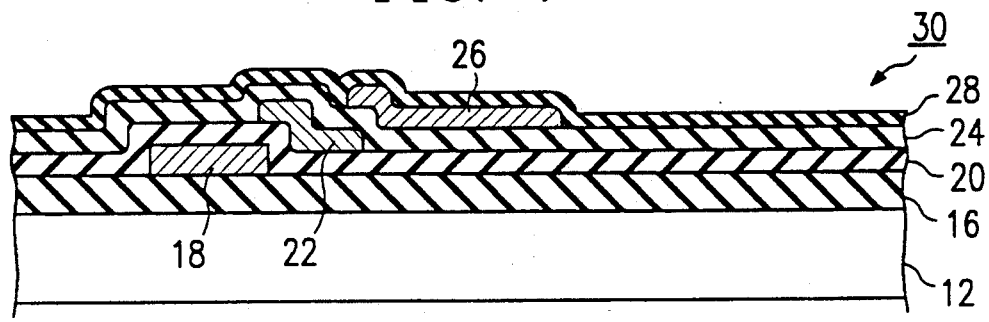
FIG. 2 is a cross-sectional view showing an example of an alternate embodiment illustrating the deposition steps in the zinc sulfide process of the present invention.

FIG. 2 illustrates a charge coupled device (CCD) 30 also formed in accordance with the present invention. As in device 10, device 30 is formed of a plurality of zinc sulfide films deposited onto a substrate interconnecting a plurality of conductive layers. Specifically, substrate 12 has a first layer of zinc sulfide 16 deposited onto its exposed surface. Next, a conductive material 18 is formed onto the first zinc sulfide layer 16. This process is repeated until conductive layer 22 and conductive layer 26 have been isolated between second zinc sulfide layer 20, third zinc sulfide layer 24 and fourth zinc sulfide layer 28, respectively.

The present method of depositing the zinc sulfide film onto the substrate of an integrated circuit will now be described. The deposition of a zinc sulfide (ZnS) film using dimethylzinc (DMZ) gas and hydrogen sulfide (H2S) gas in a vacuum processor provides a low temperature process that is acceptable for high-volume production of HgCdTe-based infrared focal planes. A plurality of zinc sulfide layers which are used as insulators and infrared anti-reflective coatings can be deposited in a particulate free environment which drastically improves the yield for large area focal plane arrays.

Figure 3:
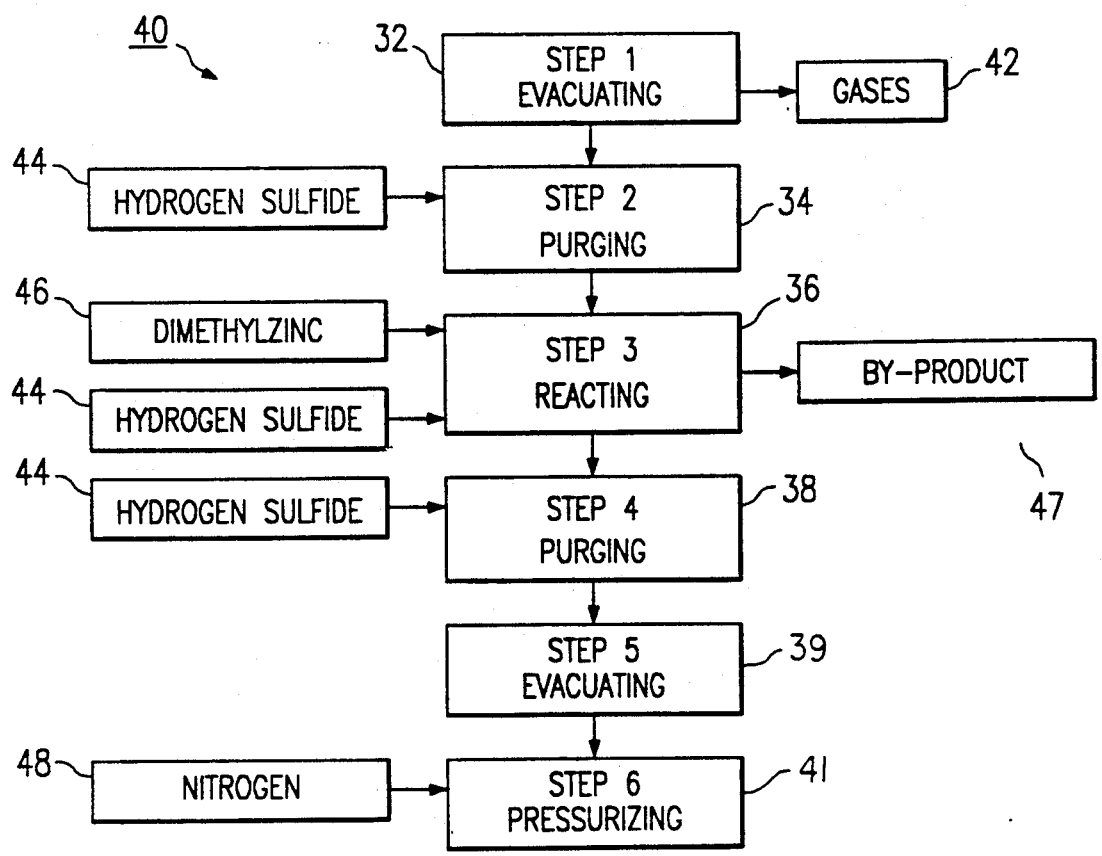
FIG. 3 is a block process flow diagram showing the zinc sulfide deposition steps performed during the metal organic chemical vapor deposition (MOCVD) reaction.

Referring to FIG. 3, the present process for forming zinc sulfide films in a low temperature vacuum system is illustrated. Process 40 comprises the steps of evacuating purging, reacting, purging, evacuating and pressurizing of a vacuum chamber. Initially, a substrate or slice is introduced into the chamber at evacuating step 32, and the chamber is evacuated to remove all entrained gases 42. After the chamber has been thoroughly evacuated, purging step 34 forces hydrogen sulfide gas 44 into the chamber at a pressure less than one atmosphere to ensure complete exposure of gas 44 throughout the chamber. In the preferred embodiment, purging step 34 consists of pressurization of the chamber with hydrogen sulfide for two minutes at 150 to 500 millitorr, to allow the slice to stabilize at the desired reaction conditions. After sufficient pressurization has occurred within the chamber, reacting step 36 commences by flowing dimethylzinc gas 46, in addition to hydrogen sulfide throughout the chamber. Unreacted gases (dimethylzinc and hydrogen sulfide) and reaction products (methane or other hydrocarbons produced from the reaction) are removed from the chamber through a suitable path. The growth-rate of the zinc sulfide film is determined by controlling the flow-rate of dimethylzinc gas 46 through the chamber during reacting step 36 of the process. Consequently, the film growth is terminated by shutting off the flow of dimethylzinc gas 46. The gas composition at this point in the process consists of unreacted dimethylzinc, unreacted hydrogen sulfide, and methane (or other hydrocarbon) which is produced as a by-product when the zinc sulfide film is formed on the substrate surface.

The zinc sulfide film is deposited in an MOCVD reactor according to the reaction below:

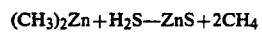

$$(CH_3)_2Zn + H_2S \rightarrow ZnS + 2CH_4$$

In a post-deposition purging step 38, hydrogen sulfide gas 44 flows through the chamber to ensure that all dimethylzinc gas 46 is expelled from the chamber. The reaction chamber is then evacuated to ensure that all of the poisonous hydrogen sulfide gas 44 is expelled from the chamber before an operator removes the slice from the automated system. In order to retrieve a slice from the system, the system must be pressurized. The chamber is pressurized with nitrogen gas 48. Once the reactor is pressurized to atmospheric pressure, the slice can be retrieved from the cassette in the load-lock which will be discussed in subsequent disclosure. Alternatively, following Step 5, additional substrates may be transferred into the reactor from the cassette located in the load-lock and ZnS films deposited on them using the procedure illustrated in FIG. 3. When all substrates have been processed, Step 6, pressurization of the reactor, is done in order to retrieve the ZnS coated substrates.

Figure 4:
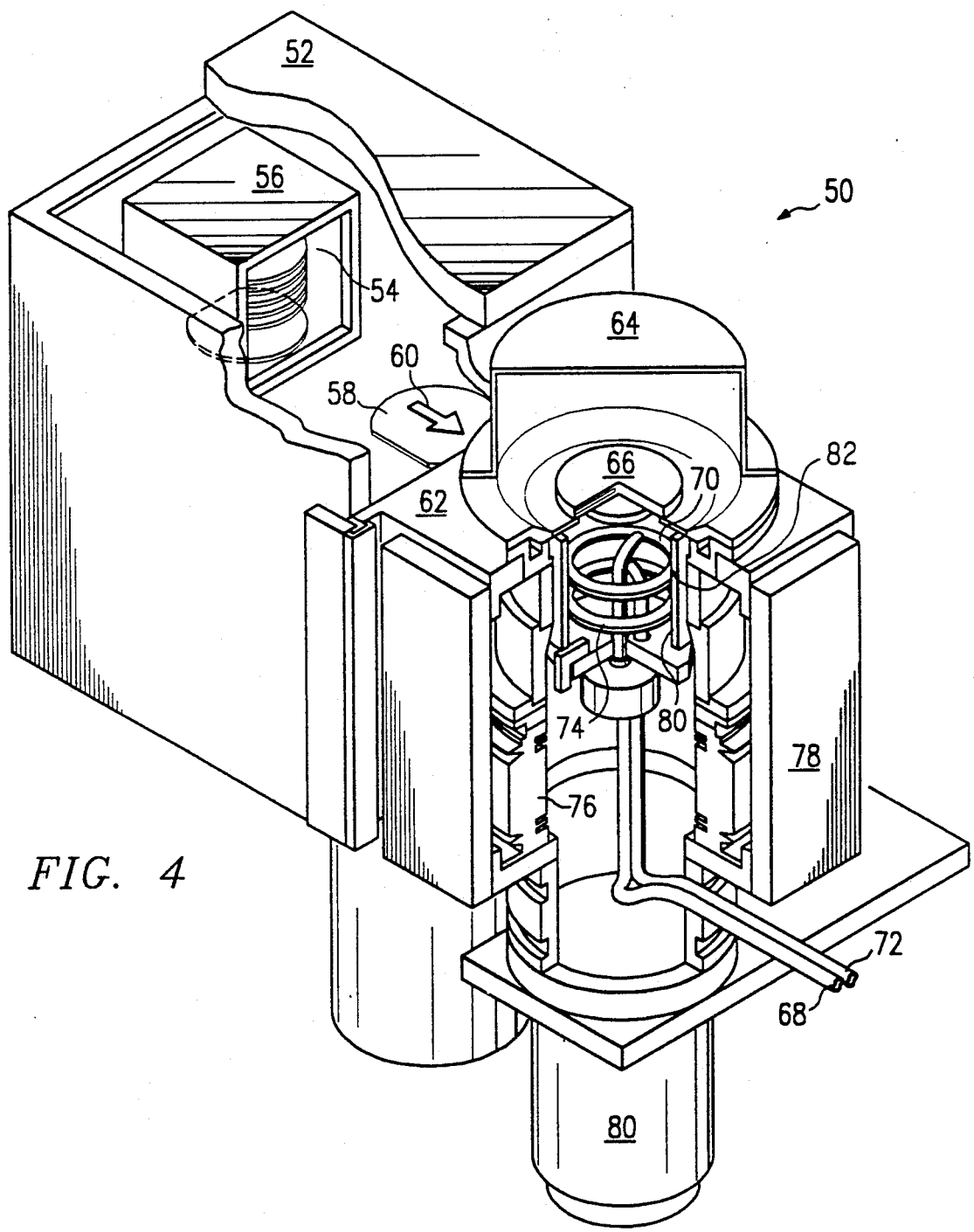
FIG. 4 is a perspective view of a particular embodiment of the present invention showing the load-lock and the reaction chamber and their associated structures necessary to form the zinc sulfide films.

FIG. 4 illustrates a vacuum chamber device 50 for depositing a layer of zinc sulfide on the surface of a selected substrate. Housing 52 forms a vacuum load-lock assembly, which houses a plurality (up to 25) of slices 54 stacked within a slide carrier 56. Housing 52 is evacuated to ensure that all gases are withdrawn to eliminate any interference or contamination of these gases with the reaction of interest After evacuation, a conventional automatic handling assembly 58 carries one of the slices 54 in the direction of arrow 60 to process chamber assembly 62. To reduce the extent of contamination on the surface of slices 54, they are inverted in process chamber assembly 62. Once a slice 54 has been placed into process chamber assembly 62, a heater substrate 66 contacts the back-side of slice 54. The temperature of heater substrate 66 is monitored and controlled by a thermocouple probe placed into the hot-plate. A heater shroud 64 covers and protects heater substrate 66.

The two gases necessary for forming the zinc sulfide film are introduced into chamber assembly 62 through gas lines 68 and 72. In the preferred embodiment, hydrogen sulfide gas is supplied through line 68 and dimethylzinc gas is supplied through line 72. A first dispersion ring 70 and a second dispersion ring 74 evenly disperse the hydrogen sulfide gas and dimethylzinc gas from lines 68 and 72, respectively.

A pressure gauge is embodied within the interior of device 50 for monitoring and controlling the internal pressure of the reactor As can be appreciated, extensive precautions must be taken to eliminate gas leaks from the reactor because hydrogen sulfide gas is poisonous to humans. The vacuum pumps of the system are located below pump valve assembly 80. Gases flow from dispersion rings 70 and 74 to slice 54 and out of inner liner 82 to a vacuum pump (not shown) located below pump valve assembly 80. The steps as described in FIG. 3 are conducted in chamber assembly 62 to deposit the zinc sulfide layer onto slice 54.

When utilizing device 50 as shown in FIG. 4, it is possible to deposit zinc sulfide film using dimethylzinc gas and hydrogen sulfide gas at low substrate temperature in a conformal and uniform manner. The deposition rate of the zinc sulfide onto the substrate is controlled by the relative volume of the hydrogen sulfide to dimethylzinc in the chamber, the pressure of the chamber, and the substrate temperature. The key process parameters include the substrate temperature, the pressure, the dimethylzinc flow rate and the hydrogen sulfide flow rate.

EXAMPLE

An experiment in accordance with the present invention was performed using 100 mm diameter single crystal silicon wafers. The ZnS films were deposited in the reactor of FIG. 4. For the characterization experiment, 30 silicon wafers were processed using a three-factor, three-level "Box-Behnken" statistical design See G.E.P. Box and D. W. Behnken, *Technometrics*, 2, 455 (1960). The substrate heater temperature (T), the process chamber pressure (P), and the dimethylzinc flow rate (Z) were selected as the three factors; the hydrogen sulfide flow rate was set to give a constant 6:1 $H_2S:DMZ$ ratio. Deposition time was set to 5.0 minutes. The parameter ranges and the experimental design are summarized in Table I below, together with the average film thickness (Tavg) and thickness non-uniformity (NU) responses. The experiment was run in three blocks corresponding to the three temperature levels; however, the run order within each block was completely randomized.

TABLE I

| FACTOR | PARAMETER | LEVEL "−1" | "0" | "+1" |
|---|---|---|---|---|
| T | Temperature (deg. C.) | 30 | 50 | 70 |
| P | Pressure (mTorr) | 100 | 200 | 300 |
| Z | DMZ Flow Rate (sccm) | 3 | 6 | 9 |

| FACTORS | | | RESPONSES | |
|---|---|---|---|---|
| T | P | Z | Tavg (A) | NU (%) |
| −1 | −1 | 0 | 651 | 9.6 |
| −1 | 0 | −1 | 826 | 5.4 |
| −1 | 0 | +1 | 962 | 5.0 |
| −1 | +1 | 0 | 1075 | 2.7 |
| 0 | −1 | −1 | 1271 | 12.2 |
| 0 | −1 | +1 | 1590 | 6.5 |
| 0 | 0 | 0 | 2143 | 3.6 |
| 0 | 0 | 0 | 2148 | 5.9 |
| 0 | 0 | 0 | 2136 | 5.4 |
| 0 | +1 | −1 | 2067 | 8.6 |
| 0 | +1 | +1 | 2819 | 3.1 |
| +1 | −1 | 0 | 3158 | 3.1 |
| +1 | 0 | −1 | 3836 | 13.5 |
| +1 | 0 | +1 | 5371 | 2.9 |
| +1 | +1 | 0 | 5920 | 5.7 |

In the above embodiment of the present invention, the randomized parameters produced an average film thickness (Tavg) that ranged between approximately 651 angstroms and approximately 5920 angstroms, and a thickness non-uniformity (NU) that ranged between approximately 2.7% and approximately 13.5%. By careful selection of parameter settings, a film thickness nonuniformity for a 2000 angstrom film (across a 100 mm diameter substrate) of less than 2% can be routinely achieved.

While preferred embodiments of the invention and their advantages have been disclosed in the above Detailed Description, the invention is not limited thereto, but only by the spirit and scope of the appended claims.

What is claimed is:

1. A process for depositing a layer of zinc sulfide on a surface of a semiconductor substrate including mercury, the substate contained in a vacuum chamber, the method comprising the steps of:
   evacuating the chamber to approximately one millitorr to expel contaminates;
   introducing a hydrogen sulfide gas into the chamber to pressurize the chamber for two minutes to approximately 150–500 millitorr;
   introducing a dimethylzinc gas through the chamber to react with the hydrogen sulfide gas to form said zinc sulfide layer on the surface of said substrate;
   maintaining the temperature inside the vacuum chamber at 100° C. or less;
   controlling the chemical reaction between the hydrogen sulfide gas and the dimethylzinc gas by controlling the flow rate of the dimethylzinc gas through the chamber;
   maintaining hydrogen sulfide gas flow into said chamber with dimethylzinc flow ceased to expel and remaining dimethylzinc gas;
   evacuating all gases from the reaction chamber; and
   pressurizing the chamber with a nitrogen gas.

2. The process of claim 1, wherein a thickness of the deposited zinc sulfide layer is determined by the duration of the reaction between the dimethylzinc gas and the hydrogen sulfide gas.

3. The process of claim 1 and further comprising inverting said substrate in said chamber to reduce the extent of contamination on the surface of the substrate.

4. The process of claim 1, wherein a ratio of the hydrogen sulfide gas to the dimethylzinc gas is approximately 6:1.

5. The process of claim 1, wherein the semiconductor substrate is mercury cadmium telluride.

* * * * *